United States Patent
Fukushima et al.

(10) Patent No.: US 12,273,997 B2
(45) Date of Patent: Apr. 8, 2025

(54) WIRING CIRCUIT BOARD

(71) Applicant: NITTO DENKO CORPORATION, Osaka (JP)

(72) Inventors: Rihito Fukushima, Osaka (JP); Hayato Takakura, Osaka (JP); Shuichi Wakaki, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 657 days.

(21) Appl. No.: 17/296,805

(22) PCT Filed: Oct. 28, 2019

(86) PCT No.: PCT/JP2019/042196
§ 371 (c)(1),
(2) Date: May 25, 2021

(87) PCT Pub. No.: WO2020/110552
PCT Pub. Date: Jun. 4, 2020

(65) Prior Publication Data
US 2022/0007507 A1  Jan. 6, 2022

(30) Foreign Application Priority Data

Nov. 27, 2018  (JP) .................................. 2018-221132

(51) Int. Cl.
*H05K 1/11* (2006.01)
*H05K 3/20* (2006.01)

(52) U.S. Cl.
CPC ............... *H05K 1/11* (2013.01); *H05K 3/205* (2013.01); *Y10T 29/5313* (2015.01)

(58) Field of Classification Search
CPC ........ H05K 1/11; H05K 1/0243; H05K 3/285; H05K 3/3452; H05K 3/424; Y10T 29/49155; Y10T 29/5313

(Continued)

(56) References Cited

U.S. PATENT DOCUMENTS

2003/0141596 A1* 7/2003 Nakamura .......... H01L 25/0657
257/E23.125
2005/0218491 A1  10/2005 Sasaki et al.
(Continued)

FOREIGN PATENT DOCUMENTS

| CN | 1863435 A | 11/2006 |
|---|---|---|
| JP | 2003-078234 A | 3/2003 |
| JP | 2005-317901 A | 11/2005 |
| JP | 2008-218728 A | 9/2008 |
| JP | 2011-100792 A | 5/2011 |
| JP | 2014-210959 A | 11/2014 |

(Continued)

OTHER PUBLICATIONS

Office Action, issued by the Taiwanese Patent Office on Jul. 18, 2023, in connection with Taiwanese Patent Application No. 108140431.

(Continued)

*Primary Examiner* — Thiem D Phan
(74) *Attorney, Agent, or Firm* — Edwards Neils LLC; Jean C. Edwards, Esq.

(57) ABSTRACT

A wiring circuit board includes a base insulating layer, a conductive layer, and a metal protective film in order toward one side in a thickness direction. The conductive layer includes a signal wiring and a terminal continuous therewith. The signal wiring has one surface in the thickness direction, and first and second surfaces continuous with the one surface and disposed to face each other in a width direction. The terminal has one surface in the thickness direction, and the other surface disposed to face the one surface at the other side in the thickness direction at spaced intervals thereto. The other surface of the terminal is exposed from the base insulating layer toward the other side in the thickness direction. The metal protective film covers the one surface of the signal wiring and one surface of the terminal but not both first or second surfaces.

4 Claims, 5 Drawing Sheets

(58) Field of Classification Search
USPC .................................. 29/846, 825, 829, 842
See application file for complete search history.

(56) References Cited

U.S. PATENT DOCUMENTS

| | | | |
|---|---|---|---|
| 2006/0257793 A1 | 11/2006 | Koizumi | |
| 2008/0217048 A1 | 9/2008 | Kamei et al. | |
| 2011/0169164 A1* | 7/2011 | Nakamura | H05K 3/10 |
| | | | 174/250 |
| 2013/0122216 A1 | 5/2013 | Tarng et al. | |
| 2013/0164440 A1 | 6/2013 | Kaneko et al. | |
| 2014/0311776 A1 | 10/2014 | Takakura | |
| 2016/0044783 A1 | 2/2016 | Furutani et al. | |

FOREIGN PATENT DOCUMENTS

| | | |
|---|---|---|
| JP | 2015-168733 A | 9/2015 |
| JP | 2016-039302 A | 3/2016 |

OTHER PUBLICATIONS

Reconsideration Report by Examiner, issued by the Japanese Patent Office on Jul. 25, 2023, in connection with Japanese Patent Application No. 2018-221132.

Office Action, issued by the Japanese Patent Office on Aug. 2, 2022, in connection with Japanese Patent Application No. 2018-221132.

International Search Report Issued in PCT/JP2019/042196 on Dec. 17, 2019.

Written Opinion Issued in PCT/JP2019/042196 on Dec. 17, 2019.

International Preliminary Report on Patentability issued by WIPO on May 25, 2021, in connection with International Patent Application No. PCT/JP2019/042196.

Office Action, issued by the Japanese Patent Office on Jan. 24, 2023, in connection with Japanese Patent Application No. 2018-221132.

Office Action issued by the Korean Intellectual Property Office on Apr. 15, 2024, in connection with Korean Patent Application No. 10-2021-7015138.

Office Action issued by the State Intellectual Property Office of China on Apr. 29, 2024, in connection with Chinese Patent Application No. 201980077418.3.

Office Action issued by the Taiwanese Patent Office on Feb. 29, 2024, in connection with Taiwanese Patent Application No. 108140431.

Office Action issued by the Korean Intellectual Property Office on Dec. 6, 2024, in connection with Korean Patent Application No. 10-2021-7015138.

Office Action issued by the State Intellectual Property Office of China on Dec. 10, 2024, in connection with Chinese Patent Application No. 201980077418.3.

* cited by examiner

FIG. 1
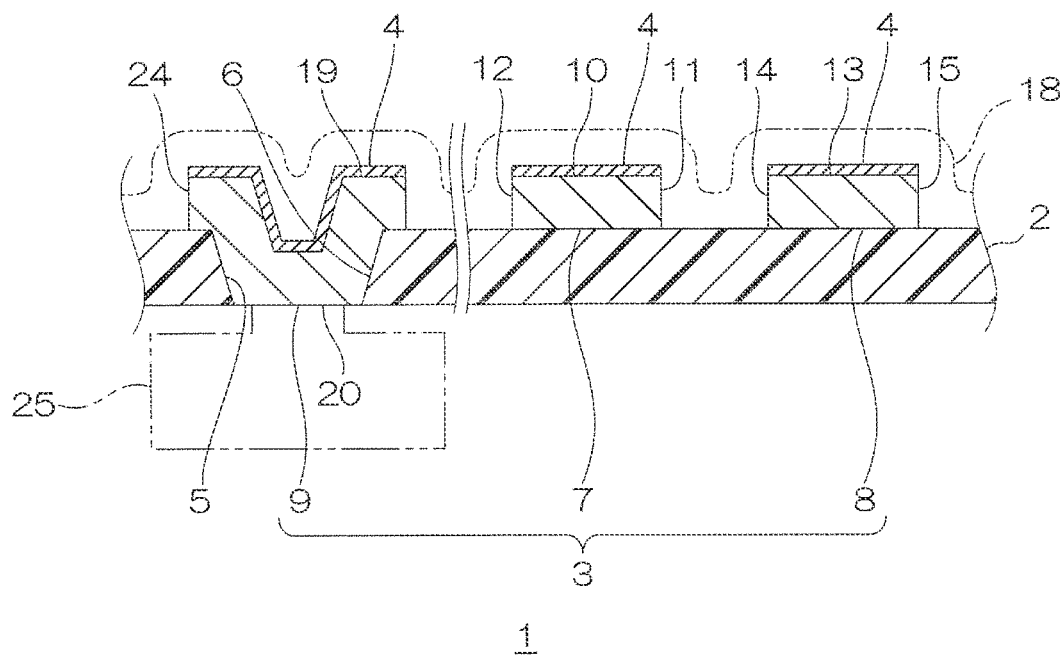
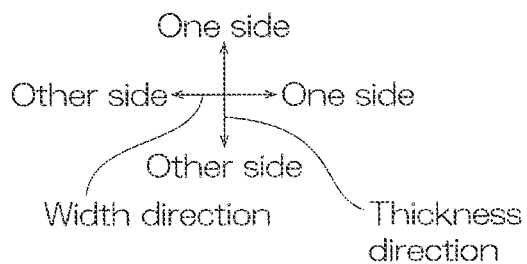

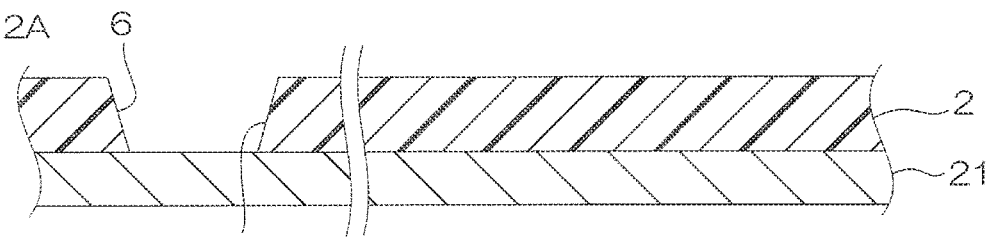
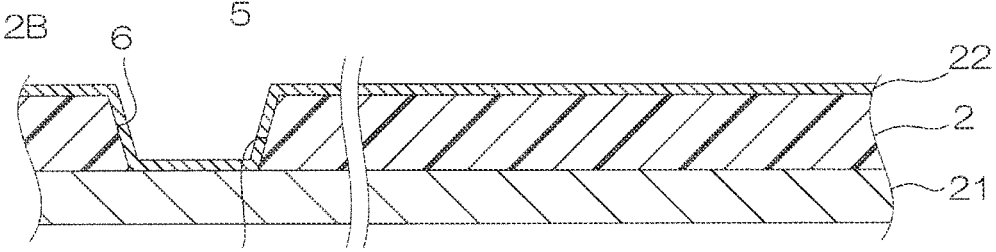
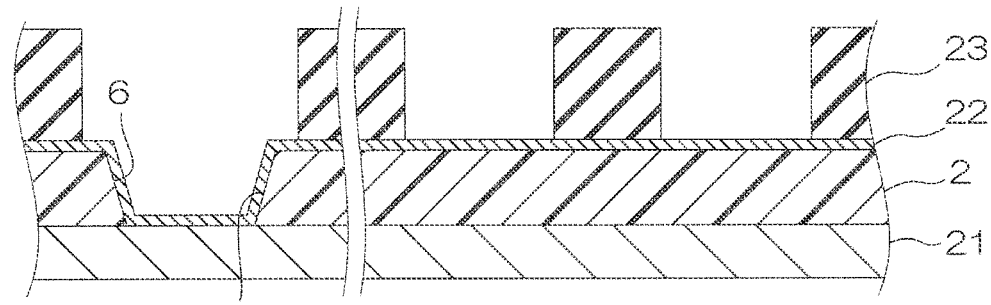
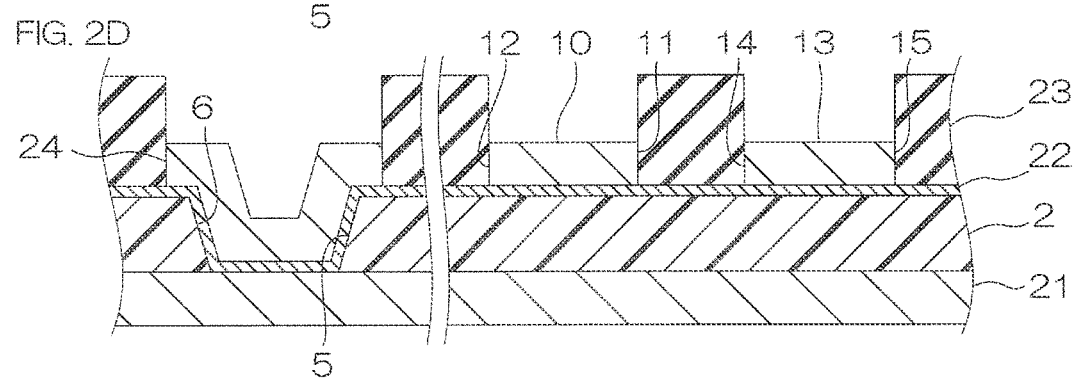
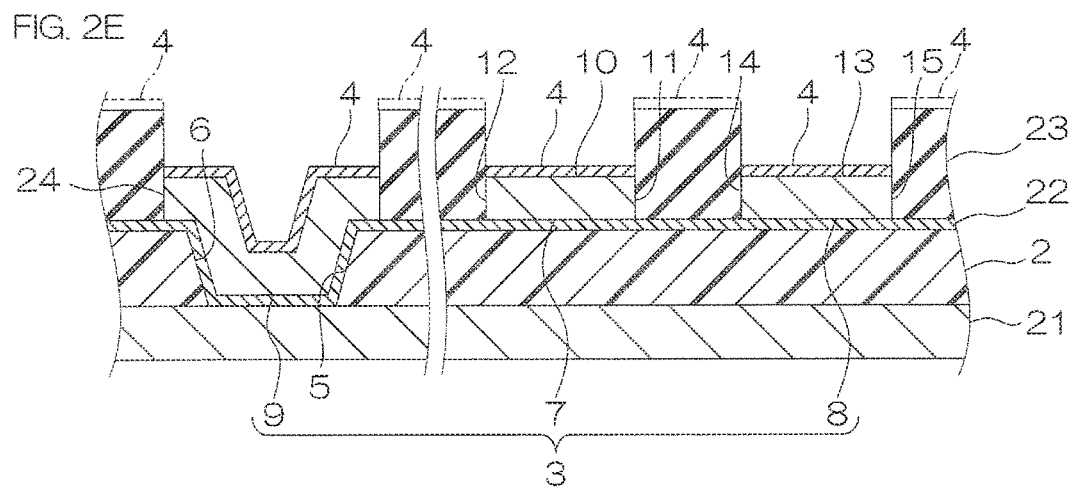

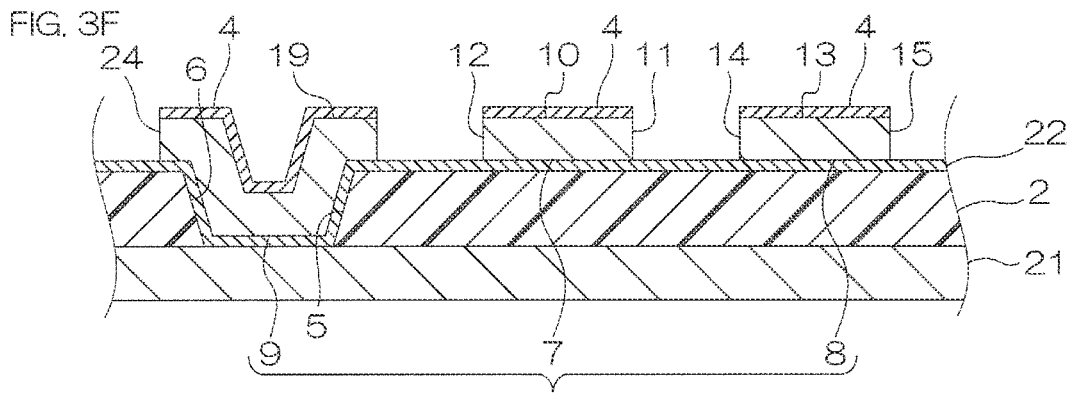
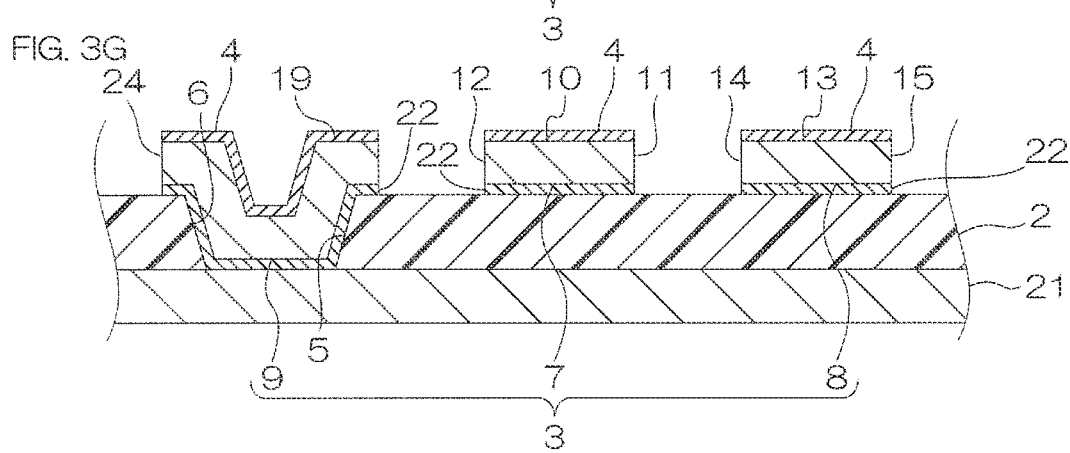
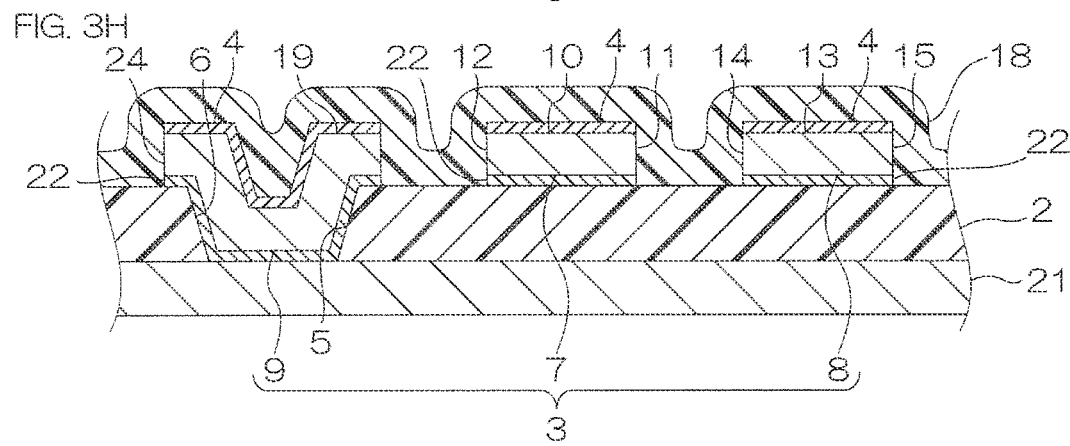
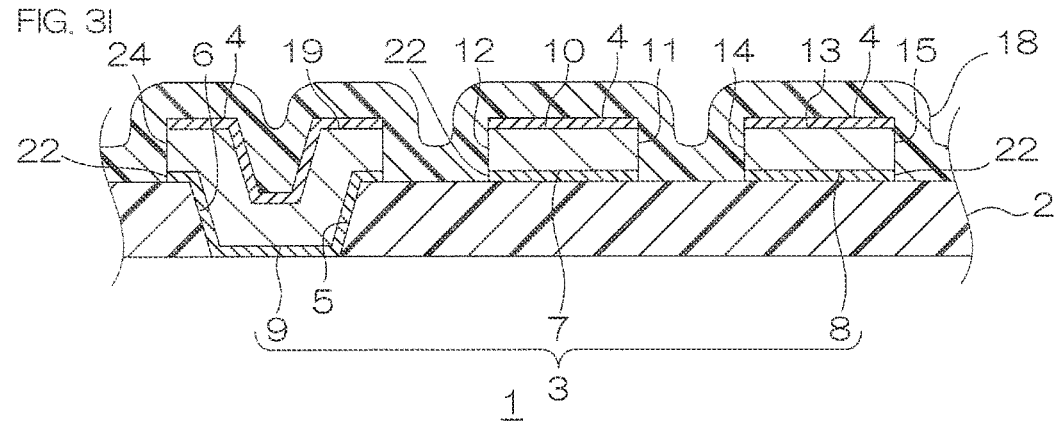

WIRING CIRCUIT BOARD

CROSS-REFERENCE TO RELATED APPLICATIONS

The present application is a 35 U.S.C. 371 National Stage Entry of PCT/JP2019/042196, filed on Oct. 28, 2019, which claims priority from Japanese Patent Application No. 2018-221132, filed on Nov. 27, 2018, the contents of all of which are herein incorporated by reference in their entirety.

TECHNICAL FIELD

The present invention relates to a wiring circuit board and a method for producing a wiring circuit board.

BACKGROUND ART

Conventionally, a wiring circuit board including a base insulating layer, a conductive layer made of copper, a metal thin film made of nickel, and a cover insulating layer in order upwardly has been known (ref: for example, Patent Document 1 below). In the wiring circuit board, the conductive layer includes a terminal and a plurality of signal wirings.

In a method for producing a wiring circuit board, first, a seed film (base) is formed on the surface of the base insulating layer, next, a plating resist is formed on the surface of the seed film in a reverse pattern to the conductive layer, then, the conductive layer is formed by electrolytic plating for supplying an electric power from the seed film, thereafter, the plating resist is removed, and further, the seed film exposed from the conductive layer is soft etched. Thereafter, a metal thin film is formed on the surface of the conductive layer by electroless plating, and then, the cover insulating layer is formed so as to cover the metal thin film. At this time, the cover insulating layer is formed by photo processing so that the metal thin film corresponding to a terminal is exposed. Thereafter, the metal thin film corresponding to the terminal is removed by etching and the like to expose the surface of the terminal.

CITATION LIST

Patent Document

Patent Document 1. Japanese Unexamined Patent Publication No. 2008-218728

SUMMARY OF THE INVENTION

Problem to be Solved by the Invention

Recently, the thinning of a wiring circuit board is required, and specifically, a wiring circuit board including a thin conductive layer is required.

However, in the wiring circuit board described in Patent Document 1, when the metal thin film corresponding to the terminal is removed, the terminal is easily damaged because it is thin. Therefore, there is a problem that connection reliability of the terminal decreases.

Further, in recent years, in order to meet the increasing demand for communication devices using a high frequency, there is a case where a high-frequency electric current flows in a signal wiring, and in such a case, in the signal wiring whose surface is covered with the above-described metal protective layer, a skin effect (phenomenon in which an electric current flows only on the surface layer of the signal wiring and is not put into the interior) becomes apparent. Therefore, there is a problem that a loss of the high-frequency signal in the signal wiring increases.

Furthermore, in a method for producing a wiring circuit board, when the seed film is soft etched, the surfaces of the plurality of thin signal wirings are unintentionally removed, and as a result, when the surfaces of the plurality of signals wirings are further thinned to the extent that affects transmission reliability of the plurality of signal wirings, there is a problem that the transmission reliability of the plurality of signal wirings decreases.

The present invention provides a wiring circuit board having excellent connection reliability of a terminal and capable of suppressing a loss of an electric current in a signal wiring, and a method for producing a wiring circuit board having excellent transmission reliability of the signal wiring and a second signal wiring, having excellent connection reliability of the terminal, and capable of suppressing the loss of the electric current in the signal wiring and the second signal wiring.

Means for Solving the Problem

The present invention (1) includes a wiring circuit board including an insulating layer, a conductive layer, and a metal protective film in order toward one side in a thickness direction, wherein the conductive layer includes a signal wiring for transmitting a signal and a terminal continuous with the signal wiring, the signal wiring has one surface in the thickness direction, and a first surface and a second surface continuous with the one surface and disposed to face each other in a direction perpendicular to a transmission direction of the signal and the thickness direction; the terminal has one surface in the thickness direction, and the other surface disposed to face the one surface at the other side in the thickness direction at spaced intervals thereto; the other surface of the terminal is exposed from the insulating layer toward the other side in the thickness direction; the metal protective film covers the one surface of the signal wiring and does not cover both the first surface and the second surface, or covers the one surface of the signal wiring and either the first surface or the second surface, and does not cover the other; and the metal protective film covers the one surface of the terminal.

In the wiring circuit board, since the other surface of the terminal is exposed from the insulating layer toward the other side in the thickness direction, it is not necessary to remove the metal thin film corresponding to the terminal and expose the one surface of the terminal from the insulating layer toward one side, and it is possible to prevent damage to the terminal. Therefore, the wiring circuit board has excellent connection reliability of the terminal. As a result, it is possible to electrically connect the terminal to an electronic element disposed on the other side of the terminal with excellent reliability.

Further, in the wiring circuit board, the metal protective film does not cover both the first surface and the second surface of the signal wiring, or does not cover any other of the first surface and the second surface. Therefore, it is possible to suppress a skin effect in the signal wiring. As a result, it is possible to decrease a loss of a high-frequency signal in the signal wiring.

The present invention (2) includes the wiring circuit board described in (1), wherein the conductive layer further includes a second signal wiring adjacent to the signal wiring in the perpendicular direction, the second signal wiring has one surface in the thickness direction, a third surface continuous with the one surface and facing a first surface, and a fourth surface continuous with the one surface and located on the opposite side of the first surface with respect to the third surface, the metal protective film covers the one surface of the second signal wiring and does not cover both the third surface and the fourth surface, or covers the one surface of the second signal wiring and either the third surface or the fourth surface, and does not cover the other.

When the conductive layer includes the signal wiring and the second signal wiring adjacent to each other, a variation (deviation) in the electric current density of the signal wiring and the second signal wiring occurs by the magnetic field generated by each of the signal wiring and the second signal wiring, and there may be a case where the loss of the high-frequency signal in each of the signal wiring and the second signal wiring increases due to a proximity effect in which the electrical resistance increases based on this.

However, in the wiring circuit board, the metal protective film does not cover both the third surface and the fourth surface of the second signal wiring, or does not cover any other of the third surface and the fourth surface of the second signal wiring. Therefore it is possible to suppress the proximity effect between the signal wiring and the second signal wiring. As a result, it is possible to decrease the loss of the high-frequency signal in each of the signal wiring and the second signal wiring.

The present invention (3) includes the wiring circuit board described in (2), wherein the metal protective film does not cover any of the first surface, the second surface, the third surface, and the fourth surface.

Further, in the wiring circuit board, since the metal protective film does not cover any of the first surface, the second surface, the third surface, and the fourth surface, it is possible to further suppress the proximity effect, while the skin effect is suppressed.

The present invention (4) includes a method for producing a wiring circuit board, the wiring circuit board described in (3), including the steps of disposing an insulating layer having an opening portion penetrating in a thickness direction on one surface in the thickness direction of a substrate, disposing a seed film on one surface in the thickness direction of the insulating layer, an inner peripheral surface of the opening portion in the insulating layer, and the one surface in the thickness direction exposed from the opening portion in the substrate, disposing a plating resist on one surface in the thickness direction of the seed film in a reverse pattern to a conductive layer, disposing the conductive layer on the one surface of the seed film by electrolytic plating for supplying an electric power to the seed film, disposing a metal protective film on one surface of the conductive layer, removing the plating resist, removing the seed film exposed from the conductive layer by soft etching, and removing the substrate.

According to the method for producing a wiring circuit board, even when the seed film is soft etched, since the metal protective film is already disposed on the one surfaces of the signal wiring and the second signal wiring, the metal protective film acts as a mask and it is possible to suppress unintentional thinning of the signal wiring and the second signal wiring. Therefore, it is possible to suppress a decrease in the transmission reliability of the signal wiring and the second signal wiring.

Further, according to the method for producing a wiring circuit board, since the other surface of the terminal is exposed from the insulating layer toward the other side in the thickness direction, it is not necessary to remove the metal thin film corresponding to the terminal and expose the one surface of the terminal from the insulating layer toward one side, and it is possible to prevent damage to the terminal. Therefore, the resulting wiring circuit board has excellent connection reliability of the terminal. As a result, it is possible to electrically connect the terminal to an electronic element disposed on the other side of the terminal with excellent reliability.

Further, in the wiring circuit board obtained by the method for producing a wiring circuit board, since the metal protective film does not cover any of the first surface, the second surface, the third surface, and the fourth surface, it is possible to suppress the skin effect in the signal wiring and the second signal wiring. As a result, it is possible to decrease the loss of the high-frequency signal in the signal wiring and the second signal wiring.

Effect of the Invention

In the wiring circuit board of the present invention, connection reliability of the terminal is excellent, and it is possible to decrease a loss of a high-frequency signal in a signal wiring.

In the method for producing a wiring circuit board of the present invention, it is possible to suppress a decrease in transmission reliability of a signal wiring and a second signal wiring, connection reliability of a terminal is excellent, and it is possible to decrease a loss of a high-frequency signal in the signal wiring and the second signal wiring.

BRIEF DESCRIPTION OF THE DRAWINGS

FIG. 1 shows a cross-sectional view of one embodiment of a wiring circuit board of the present invention.

FIGS. 2A to 2E show production process views of the wiring circuit board shown in FIG. 1;

FIG. 2A illustrating a step of disposing a base insulating layer on a substrate, FIG. 2B illustrating a step of disposing a seed film, FIG. 2C illustrating a step of disposing a plating resist, FIG. 2D illustrating a step of disposing a conductive layer, and FIG. 2E illustrating a step of disposing a metal protective film.

FIGS. 3F to 3I, subsequent to FIG. 2E, show production process views of the wiring circuit board shown in FIG. 1;

FIG. 3F illustrating a step of removing the plating resist,

FIG. 3G illustrating a step of removing the seed film exposed from the conductive layer, FIG. 3H illustrating a step of disposing a cover insulating layer, and FIG. 3I illustrating a step of removing the substrate.

DESCRIPTION OF EMBODIMENTS

Figure 4:
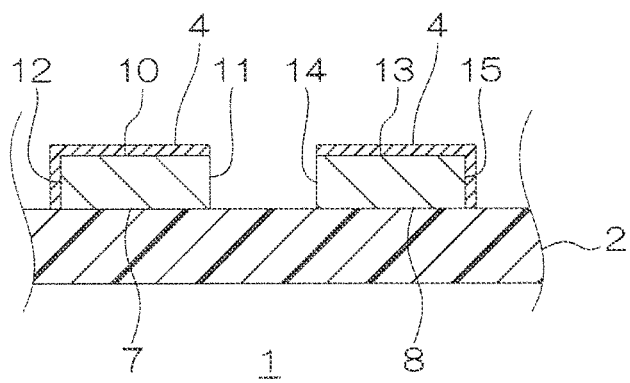
FIG. 4 shows a cross-sectional view of a modified example (embodiment in which a metal protective film does not cover a first surface and a third surface) of the wiring circuit board shown in FIG. 1.

One embodiment of a wiring circuit board of the present invention is described with reference to FIG. 1.

As shown in FIG. 1, a wiring circuit board 1 has a generally plate shape extending in a plane direction, and has one surface and the other surface facing each other in a thickness direction. The wiring circuit board 1 includes a base insulating layer 2 as one example of an insulating layer, a conductive layer 3, a metal protective film 4, and a cover insulating layer 18 in order toward one side in the thickness direction.

The base insulating layer 2 has the same outer shape as the wiring circuit board 1, and specifically, the base insulating layer 2 has one surface and the other surface facing each other in the thickness direction. The one surface and the other surface of the base insulating layer 2 have flat shapes parallel to each other. Further, the base insulating layer 2 has an opening portion 5 corresponding to a terminal 9 to be described next. The opening portion 5 is a through hole penetrating the base insulating layer 2 in the thickness direction.

An example of a material for the base insulating layer 2 includes an insulating resin such as a polyimide resin. A thickness of the base insulating layer 2 is a length between the one surface and the other surface, and is, for example, 1 μm or more, preferably 5 μm or more, and for example, 30 μm or less, preferably 20 μm or less.

The conductive layer 3 is disposed on the one surface of the base insulating layer 2. The conductive layer 3 includes a signal wiring 7, a second signal wiring 8, and the terminal 9.

The signal wiring 7 is an electric wiring for transmitting a signal at one side in the thickness direction of the base insulating layer 2. Specifically, the signal wiring 7, together with the second signal wiring 8, is a differential wiring for transmitting a differential signal. The signal wiring 7 has a generally rectangular shape in a cross-sectional view along a width direction (one example of a perpendicular direction) perpendicular to a direction for transmitting the signal (high-frequency signal and the like) (transmission direction) (corresponding to a paper thickness direction or a depth direction on the plane of the sheet). Specifically, the signal wiring 7 continuously has one surface 10 and the other surface facing each other in the thickness direction, and a first surface 11 and a second surface 12 facing each other in the width direction.

The one surface 10 and the other surface of the signal wiring 7 have flat shapes parallel to each other. The other surface of the signal wiring 7 is in contact with the one surface of the base insulating layer 2. The one surface 10 of the signal wiring 7 is spaced apart from the other surface at one side in the thickness direction.

The first surface 11 and the second surface 12 have flat shapes parallel to each other. The first surface 11 connects one end edge in the width direction of the one surface 10 to one end edge in the width direction of the other surface. The second surface 12 connects the other end edge in the width direction of the one surface 10 to the other end edge in the width direction of the other surface. The second surface 12 is located on the opposite side of the second signal wiring 8 with respect to the first surface 11.

Although an embodiment of one end in the transmission direction of the signal wiring 7 is not specifically shown in the cross-sectional view of FIG. 1, it is continuous with the terminal 9.

The second signal wiring 8, together with the signal wiring 7, is a second differential wiring for transmitting a differential signal. However, the second signal wiring 8 is independent of the signal wiring 7. The second signal wiring 8 is adjacent to the signal wiring 7 in the width direction. Specifically, the second signal wiring 8 is disposed adjacent to the signal wiring 7 at spaced intervals thereto in the width direction. The second signal wiring 8 has the same shape as the signal wiring 7 in the cross-sectional view. Specifically, the second signal wiring 8 continuously has one surface 13 and the other surface facing each other in the thickness direction, and a third surface 14 and a fourth surface 15 facing each other in the width direction.

The one surface 13 and the other surface of the second signal wiring 8 have flat shapes parallel to each other. The other surface of the second signal wiring 8 is in contact with the one surface of the base insulating layer 2. The one surface 13 of the second signal wiring 8 is spaced apart from the other surface at one side in the thickness direction.

The third surface 14 and the fourth surface 15 of the second signal wiring 8 have flat shapes parallel to each other. The third surface 14 connects the other end edge in the width direction of the one surface 13 to the other end edge in the width direction of the other surface. Further, the third surface 14 faces the first surface 11 of the signal wiring 7. Specifically, the third surface 14 faces the first surface 11 at spaced intervals thereto in the width direction. More specifically, the third surface 14 is disposed close to the first surface 11 with a narrow distance therebetween.

The fourth surface 15 is disposed at the opposite side in the width direction of the first surface 11 with respect to the third surface 14. The fourth surface 15 connects one end edge in the width direction of the one surface 13 to one end edge in the width direction of the other surface. The fourth surface 15 is located at the opposite side in the width direction of the signal wiring 7 with respect to the third surface 14.

The second signal wiring 8 is continuous with a terminal which is not shown.

A part of the terminal 9 or the entire terminal 9 fills the opening portion 5. The terminal 9 has a generally hat shape having an opening toward one side in the thickness direction in the cross-sectional view. The terminal 9 integrally has one surface 19 in the thickness direction, the other surface 20 which is disposed to face the one surface 19 at spaced intervals thereto in the thickness direction, and a peripheral side surface 24 connecting the peripheral end edge of the one surface 19 in the thickness direction to the peripheral end edge of the other surface 20.

The one surface 19 has a shape in which the central portion in the plane direction is recessed toward the other side in the thickness direction corresponding to the opening portion 5.

The central portion of the other surface 20 is exposed from the opening portion 5. Specifically, the central portion of the other surface 20 is exposed from the base insulating layer 2 toward the other side in the thickness direction. The central portion of the other surface 20 is flush with the other surface of the base insulating layer 2.

On the other hand, the peripheral end portion of the other surface 20 is along an inner peripheral surface 9 of the opening portion 5, and also covers the one surface of the base insulating layer 2 around the opening portion 5.

A material for the conductive layer 3 is a metal or alloy which is easily eroded by soft etching to be described later, and an example thereof includes a conductor such as copper.

A width of the signal wiring 7, a width of the second signal wiring 8, and an interval between the signal wiring 7 and the second signal wiring 8 are, for example, 5 µm or more, preferably 10 µm or more, and for example, 100 µm or less, preferably 50 µm or less, more preferably 25 µm or less. The maximum length in the plane direction of the terminal 9 is, for example, 10 µm or more, preferably 100 µm or more, and for example, 2,500 µm or less, preferably 500 µm or less.

A thickness of the conductive layer 3 is extremely thin, and specifically, is, for example, 10 µm or less, preferably 5 µm or less, more preferably 3 µm or less, and for example, 0.1 µm or more, more preferably 0.5 µm or more, further more preferably 1.0 µm or more.

The metal protective film 4 is a protective film which partially covers the surface of the conductive layer 3 and protects the surface. In one embodiment, the metal protective film 4 covers the one surface 10 of the signal wiring 7, the one surface 13 of the second signal wiring 8, and the one surface 19 of the terminal 9. Specifically, the metal protective film 4 is directly disposed on the one surface 10 of the signal wiring 7, the one surface 13 of the second signal wiring 8, and the one surface 19 of the terminal 9.

The metal protective film 4 has a thin film shape along the one surfaces 10, 13, and 19 described above.

On the other hand, the metal protective film 4 does not cover both the first surface 11 and the second surface 12 of the signal wiring 7, both the third surface 14 and the fourth surface 15 of the second signal wiring 8, and the peripheral side surface 24 of the terminal 9, that is, is not disposed on these surfaces (side surfaces).

Further, the metal protective film 4 is also not disposed in the central portion of the other surface 20 of the terminal 9. Furthermore, the metal protective film 4 is also not disposed on the surface (contact surface) in contact with the base insulating layer 2 of the conductive layer 3.

A material for the metal protective film 4 is a metal or alloy which is not easily eroded by soft etching to be described later, and examples thereof include nickel and a nickel alloy. Preferably, nickel and the like is used.

A thickness of the metal protective film 4 is, for example, 0.03 µm or more, preferably 0.1 µm or more, and for example, 2 µm or less, preferably 0.5 µm or less.

The cover insulating layer 18 shown by a phantom line is disposed on the one surface in the thickness direction of the base insulating layer 2 so as to cover the conductive layer 3 and the metal protective film 4. Specifically, the cover insulating layer 18 covers the first surface 11 and the second surface 12 of the signal wiring 7, the third surface 14 and the fourth surface 15 of the second signal wiring 8, and the peripheral side surface 24 of the terminal 9. Further, the cover insulating layer 18 covers one surface and a peripheral side surface of the metal protective film 4. Furthermore, the cover insulating layer 18 covers the one surface in the thickness direction of the base insulating layer 2 exposed from the conductive layer 3. A material for the cover insulating layer 18 is the same as the material for the base insulating layer 2. A thickness of the cover insulating layer 18 is, for example, 1 µm or more and 30 µm or less.

A thickness of the wiring circuit board 1 is the total thickness of the base insulating layer 2, the conductive layer 3, the metal protective film 4, and the cover insulating layer 18, and is, for example, 70 µm or less, preferably 60 µm or less, more preferably 50 µm or less, and for example, 5 µm or more.

Next, a method for producing the wiring circuit board 1 is described with reference to FIGS. 2A to 3H.

As shown in FIG. 2A, in this method, the base insulating layer 2 is disposed on one surface in the thickness direction of a substrate 21.

The substrate 21 has a generally sheet shape extending in the plane direction. The substrate 21 is removed after production of the wiring circuit board 1, while supporting each member of the wiring circuit board 1 in the middle of production of the wiring circuit board 1. Therefore, as shown in FIGS. 1 and 3I, the substrate 21 is not included in the wiring circuit board 1 after the production.

A material for the substrate 21 is not particularly limited, and examples thereof include a metal such as stainless steel, and a resin. Preferably, from the viewpoint of mechanical strength, a metal is used. A thickness of the substrate 21 is, for example, 1 µm or more and 1,000 µm or less.

Then, for example, the base insulating layer 2 having the opening portion 5 is formed on the one surface in the thickness direction of the substrate 21 by photolithography. Specifically, a varnish of a photosensitive insulating resin is applied to the one surface of the substrate 21, and thereafter, the base insulating layer 2 having the opening portion 5 is formed by exposure and development. Or, it is also possible to dispose the base insulating layer 2 in which the opening portion 5 is formed in advance on the one surface in the thickness direction of the substrate 21.

As shown in FIG. 2B, in this method, then, a seed film 22 is disposed on the one surface in the thickness direction of the base insulating layer 2, the inner peripheral surface 6 of the opening portion 5 in the base insulating layer 2, and the one surface in the thickness direction exposed from the opening portion 5 in the substrate 21.

As a method for disposing the seed film 22 on each surface described above, for example, a thin film forming method such as vapor deposition, sputtering, ion plating, and plating is used. Preferably, sputtering is used.

The seed film 22 is continuously formed on each surface described above.

As shown in FIG. 2C, next, in this method, the plating resist 23 is disposed on the one surface in the thickness direction of the seed film 22 in a reverse pattern to the conductive layer 3.

For example, the plating resist 23 is formed in the pattern described above by photolithography. Specifically, a dry film resist (not shown) is disposed on the entire one surface of the seed film 22, and then, the plating resist 23 is formed in the above-described pattern by exposure and development.

As shown in FIG. 2D, next, in this method, the conductive layer 3 is disposed on the one surface of the seed film 22 by electrolytic plating for supplying an electric power to the seed film 22.

Specifically, the substrate 21, the base insulating layer 2, the seed film 22, and the plating resist 23 are immersed in an electrolytic plating solution, subsequently, an electric power is supplied to the seed film 22, and a material (conductor) for the conductive layer 3 is deposited on the one surface of the seed film 22. Thus, the conductive layer 3 is formed in a reverse pattern to the plating resist 23.

As shown in FIG. 2E, next, the metal protective film 4 is disposed on the one surface of the conductive layer 3.

For example, the metal protective film 4 is formed by a thin film forming method such as plating (electrolytic plating, electroless plating). Preferably, the metal protective film 4 is formed on the one surface 10 of the signal wiring 7, the one surface 13 of the second signal wiring 8, and the one surface 19 of the terminal 9 by electroless plating.

Thus, the metal protective film 4 is formed on the one surface of the conductive layer 3 exposed from the plating resist 23.

In the above-described thin film forming method, the metal protective film 4 is not formed on the first surface 11 and the second surface 12 of the signal wiring 7, the third surface 14 and the fourth surface 15 of the second signal wiring 8, and the peripheral side surface 24 of the terminal 9 by a mask function of the plating resist 23.

Further, in the above-described thin film forming method, the formation (ref: phantom line) of the metal protective film 4 on the one surface of the plating resist 23 is allowed.

As shown in FIG. 3F, next, the plating resist 23 is removed. When the metal protective film 4 is formed on the one surface of the plating resist 23 (ref: phantom line), the plating resist 23, together with the metal protective film 4 described above, is removed.

Thus, the seed film 22 corresponding to the plating resist 23 is exposed from the conductive layer 3.

As shown in FIG. 3G, next, the seed film 22 exposed from the conductive layer 3 is removed by soft etching.

In the soft etching, conditions (etching solution, time, temperature, and the like) for dissolving the seed film 22 exposed from the conductive layer 3 are selected.

On the other hand, the seed film 22 sandwiched between the base insulating layer 2 and the conductive layer 3 in the thickness direction is not substantially dissolved.

However, in the soft etching, slight erosion (recession toward the center in the width direction) is allowed in the first surface 11 and the second surface 12 of the signal wiring 7, the third surface 14 and the fourth surface 15 of the second signal wiring 8, and the peripheral side surface 24 of the terminal 9.

Further, in the soft etching, the erosion (erosion toward the other side in the thickness direction, hereinafter, the same) of the one surface 10 of the signal wiring 7, the erosion of the one surface 13 of the second signal wiring 8, and the erosion of the one surface 19 of the terminal 9 are suppressed by the mask function of the metal protective film 4.

In the above-described soft etching, slight etching (removal) of the metal protective film 4 is allowed, and specifically, etching of the metal protective film 4 at a smaller amount than the seed film 22 is allowed.

As shown in FIG. 3H, the cover insulating layer 18 is disposed on the one surface in the thickness direction of the base insulating layer 2 so as to cover the conductive layer 3 and the metal protective film 4.

Thereafter, as shown in FIG. 3I, the substrate 21 is removed.

Specifically, when the substrate 21 is a metal, for example, a release agent (release liquid and the like) is used to remove the substrate 21. Further, when the substrate 21 is a resin, the substrate 21 is peeled from the other surface of the base insulating layer 2.

Thus, the wiring circuit board 1 including the base insulating layer 2, the seed film 22, the conductive layer 3, the metal protective film 4, and the cover insulating layer 18 is produced.

In the wiring circuit board 1, a boundary between the seed film 22 and the conductive layer 3 becomes obscure, that is, there is a case where the seed film 22 is included in the conductive layer 3. In such a case, the presence of the seed film 22 is not clearly grasped, and as described in FIG. 1, the wiring circuit board 1 includes the base insulating layer 2, the conductive layer 3, the metal protective film 4, and the cover insulating layer 18.

Thereafter, the wiring circuit board 1 is electrically connected to an electronic element 25 disposed at the other side in the thickness direction thereof. The electronic element 25 is in contact with the central portion of the oilier surface 20 of the terminal 9.

Then, in the wiring circuit board 1, since the central portion of the other surface 20 of the terminal 9 is exposed from the base insulating layer 2 toward the other side in the thickness direction, it is not necessary to remove the metal protective film 4 covering the one surface 19 of the terminal 9 and expose the one surface 19 of the metal protective film 4 from the base insulating layer 2 toward one side, and it is possible to prevent damage to the thin (for example, 10 μm or less) terminal 9. Therefore, the wiring circuit board 1 has excellent connection reliability of the terminal 9. As a result, it is possible to electrically connect the terminal 9 to the electronic element 25 disposed on the other side of the terminal 9 with excellent reliability.

Further, in the wiring circuit board 1, the metal protective film 4 does not cover both the first surface 11 and the second surface 12 of the signal wiring 7. Therefore, it is possible to suppress a skin effect in the signal wiring 7. As a result, it is possible to decrease a loss of a high-frequency signal in the signal wiring 7.

However, in the wiring circuit board 1, since the conductive layer 3 includes the signal wiring 7 and the second signal wiring 8 adjacent to each other, the loss of the high-frequency signal in each of the signal wiring 7 and the second signal wiring 8 may increase due to a proximity effect.

However, in the wiring circuit board 1 of one embodiment, the metal protective film 4 does not cover both the third surface 14 and the fourth surface 15 of the second signal wiring 8. Therefore, it is possible to suppress the proximity effect between the signal wiring 7 and the second signal wiring 8. As a result, it is possible to decrease the loss of the high-frequency signal in each of the signal wiring 7 and the second signal wiring 8.

Further, in the wiring circuit board 1, since the metal protective film 4 does not cover any of the first surface 11, the second surface 12, the third surface 14, and the fourth surface 15, it is possible to further suppress the proximity effect, while the skin effect is suppressed.

Furthermore, according to the method for producing the wiring circuit board 1, as shown in FIG. 3G, even when the seed film 22 is soft etched, since the metal protective film 4 is already disposed on the one surface 10 of the signal wiring 7 and the one surface 13 of the second signal wiring 8, the metal protective film 4 acts as a mask and it is possible to suppress unintentional thinning of the signal wiring 7 and the second signal wiring 8. Therefore, it is possible to suppress a decrease in the transmission reliability of the signal wiring 7 and the second signal wiring 8.

Further, according to the method for producing the wiring circuit board 1, since the central portion of the other surface 20 of the terminal 9 is exposed from the base insulating layer 2 toward the other side in the thickness direction, it is not necessary to remove the metal thin film 4 corresponding to the terminal 9 and expose the one surface 19 of the terminal 9 from the base insulating layer 2 toward one side, and it is possible to prevent damage to the terminal 9. Therefore, the resulting wiring circuit board 1 has excellent connection reliability of the terminal 9. As a result, it is possible to electrically connect the terminal 9 to an electronic element disposed on the other side of the terminal 9 with excellent reliability.

Further, in the wiring circuit board 1 obtained by the method for producing the wiring circuit board 1, since the metal protective film 4 does not cover any of the first surface 11, the second surface 12, the third surface 14, and the fourth surface 15, it is possible to suppress the skin effect in the signal wiring 7 and the second signal wiring 8. As a result, it is possible to decrease the loss of the high-frequency signal in the signal wiring 7 and the second signal wiring 8.

Modified Examples

In the following each of the modified examples, the same reference numerals are provided for members and steps corresponding to each of those in the above-described one embodiment, and their detailed description is omitted. Further, each of the modified examples can achieve the same function and effect as that of one embodiment unless otherwise specified. Furthermore, one embodiment and the modified examples can be appropriately used in combination.

In FIGS. 4 to 8, the cover insulating layer 18 is omitted in order to clearly show the relative arrangement of the metal protective film 4 with respect to the conductive layer 3.

Figure 5:
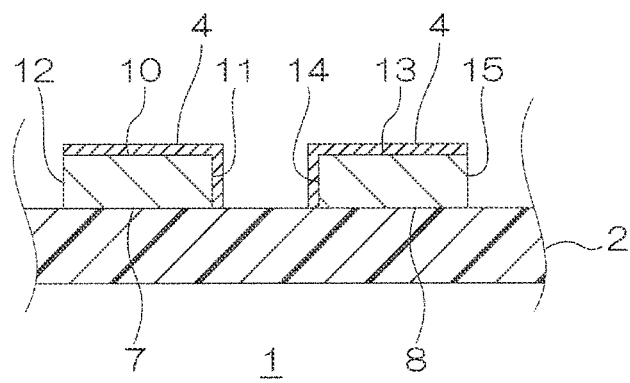
FIG. 5 shows a cross-sectional view of a modified example (embodiment in which a metal protective film does not cover a second surface and a fourth surface) of the wiring circuit board shown in FIG. 1.

As shown in FIG. 4, the metal protective film 4 can also cover the second surface 12 find the fourth surface 15 at both outer sides in the width direction without covering the first surface 11 and the third surface 14 facing each other in the width direction Alternatively, as shown in FIG. 5, the metal protective film 4 can also cover the first surface 11 and the third surface 14 without covering the second surface 12 and the fourth surface 15.

Of one embodiment shown in FIG. 1, and the modified examples shown in FIGS. 4 and 5, from the viewpoint of further decreasing the proximity function effect, one embodiment shown in FIG. 1 and the modified example shown in FIG. 4 are preferable.

Figure 6:
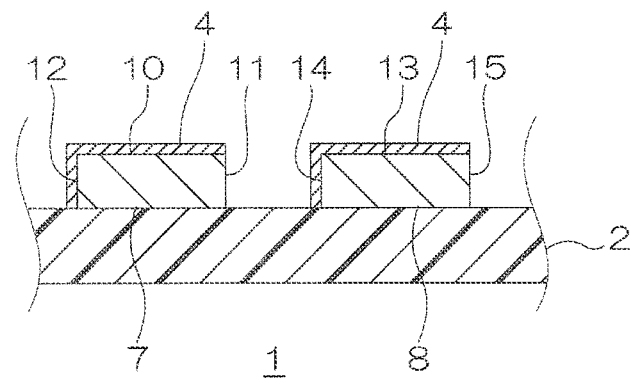
FIG. 6 shows a cross-sectional view of a modified example (embodiment in which a metal protective film does not cover a first surface and a fourth surface) of the wiring circuit board shown in FIG. 1.

Furthermore, as shown in FIG. 6, the metal protective film 4 can also cover the second surface 12 and the third surface 14 without covering the first surface 11 and the fourth surface 15. Alternatively, though not shown, this may be reversed.

Figure 7:
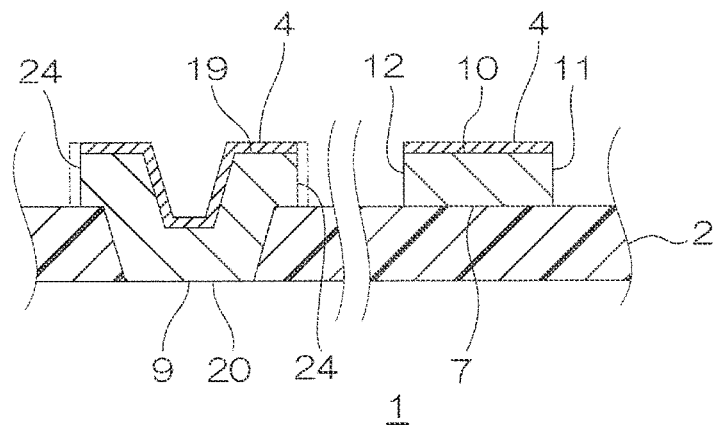
FIG. 7 shows a cross-sectional view of a modified example (embodiment in which a conductive layer does not include a second signal wiring) of the wiring circuit board shown in FIG. 1.

Further, as shown in FIG. 7, the conductive layer 3 may also consist of the signal wiring 7 without including the second signal wiring 8.

Figure 8:
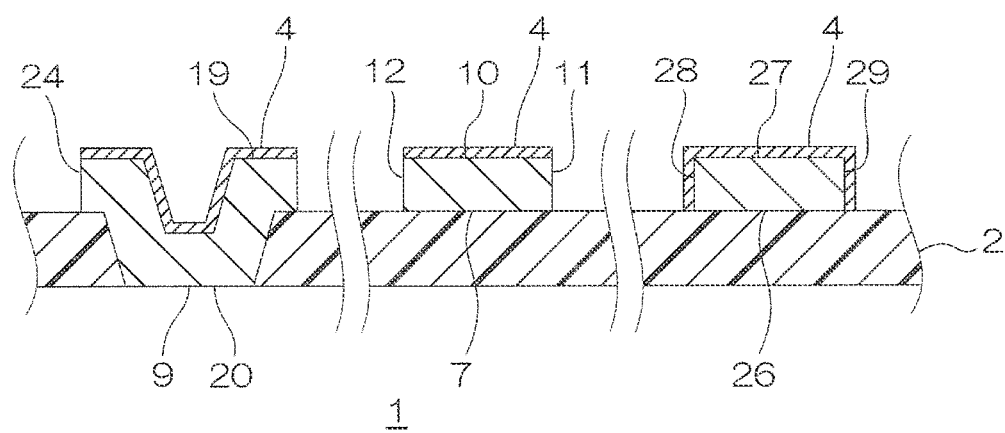
FIG. 8 shows a cross-sectional view of a modified example (embodiment in which a conductive layer includes a signal wiring and a power supply wiring) of the wiring circuit board shown in FIG. 1.

Furthermore, as shown in FIG. 8, the conductive layer 3 can also include a power supply wiring 26 which is separated from the signal wiring 7 in the width direction instead of the second signal wiring 8.

In the power supply wiring 26, a relatively large electric current flows along the transmission direction. The power supply wiring 26 has a generally rectangular shape in the cross-sectional view, and has the same shape as the signal wiring 7 in the cross-sectional view. Specifically, the power supply wiring 26 has one surface 27 and the other surface facing each other in the thickness direction, and a fifth surface 28 and a sixth surface 29 facing each other in the width direction.

The one surface 27, the fifth surface 28, and the sixth surface 29 of the power supply wiring 26 may be also covered with the metal protective film 4.

Further, as shown by the phantom line of FIG. 7, the metal protective film 4 may cover the peripheral side surface 24 of the terminal 9.

Further, in one embodiment, the wiring circuit board 1 includes the cover insulating layer 18 shown by the phantom line. Alternatively, the wiring circuit board 1 may be also configured as a solid line without including the cover insulating layer 18.

Although not shown in FIG. 1, for example, a plating layer such as a gold plating layer may be also disposed in the central portion of the other surface 20.

While the illustrative embodiments of the present invention are provided in the above description, such is for illustrative purpose only and it is not to be construed as limiting the scope of the present invention. Modification and variation of the present invention that will be obvious to those skilled in the art is to be covered by the following claims.

INDUSTRIAL APPLICATION

The wiring circuit board of the present invention is used for various applications.

DESCRIPTION OF REFERENCE NUMBER

1 Wiring circuit board
2 Base insulating layer
3 Conductive layer
4 Metal protective film
5 Opening portion
6 Inner peripheral surface
7 Signal wiring
8 Second signal wiring
9 Terminal
10 One surface (signal wiring)
11 First surface (signal wiring)
12 Second surface (signal wiring)
13 One surface (second signal wiring)
14 Third surface (second signal wiring)
15 Fourth surface (second signal wiring)
19 One surface (terminal)
20 Other surface (terminal)
21 Substrate
22 Seed film
23 Plating resist

The invention claimed is:
1. A wiring circuit board comprising:
an insulating layer having one surface and the other surface in the thickness direction, a conductive layer disposed on the one surface of the insulating layer, and a metal protective film,
wherein the conductive layer includes:
  a signal wiring for transmitting a signal, the signal wiring protruding from the one surface of the insulating layer; and
  a terminal continuous with the signal wiring, the terminal protruding from the one surface of the insulating layer;
wherein the signal wiring includes:
  one surface spaced apart from the one surface of the insulating layer toward one side in the thickness direction, and
  a first surface and a second surface continuous with the one surface of the signal wiring, and disposed on opposite sides to each other in a direction perpendicular to a transmission direction of the signal and the thickness direction, and protruding from the one surface of the insulating layer;

wherein the terminal includes:
one surface spaced apart from the one surface of the insulating layer toward one side in the thickness direction, and
the other surface exposed from the other surface of the insulating layer;
wherein the insulating layer does not cover the first surface and the second surface; and
wherein the metal protective film covers the one surface of the signal wiring and the one surface of the terminal, and does not cover at least one of the first surface and the second surface.

2. The wiring circuit board according to claim 1,
wherein the conductive layer further includes a second signal wiring adjacent to the signal wiring in the perpendicular direction,
wherein the second signal wiring includes:
one surface spaced apart from the one surface of the insulating layer toward one side in the thickness direction,
a third surface continuous with the one surface of the second signal wiring and facing the first surface, and
a fourth surface continuous with the one surface of the second signal wiring and located on the opposite side of the first surface with respect to the third surface,
wherein the metal protective film covers the one surface of the second signal wiring and does not cover at least one of the third surface and the fourth surface, or covers the one surface of the second signal wiring and either the third surface or the fourth surface, and does not cover the other.

3. The wiring circuit board according to claim 2, wherein the metal protective film does not cover any of the first surface, the second surface, the third surface, and the fourth surface.

4. The wiring circuit board according to claim 1, wherein the other surface of the terminal is flush with the other surface of the insulating layer.

* * * * *